(12) United States Patent
Young et al.

(10) Patent No.: US 6,378,109 B1
(45) Date of Patent: Apr. 23, 2002

(54) METHOD OF SIMULATION FOR GATE OXIDE INTEGRITY CHECK ON AN ENTIRE IC

(75) Inventors: Duane J. Young, Sugarland; Franciso A. Cano, Missouri City; Nagaraj N. Savithri, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/607,356

(22) Filed: Jun. 30, 2000

Related U.S. Application Data

(60) Provisional application No. 60/143,972, filed on Jul. 15, 1999, and provisional application No. 60/153,598, filed on Sep. 13, 1999.

(51) Int. Cl.[7] .............................................. G06F 17/50
(52) U.S. Cl. ................................................. 716/4; 716/2
(58) Field of Search ................................ 438/128, 129, 438/17; 716/1, 2, 4, 5

(56) References Cited

U.S. PATENT DOCUMENTS

| | | | |
|---|---|---|---|
| 5,822,218 A | * | 10/1998 | Moosa et al. |
| 5,828,580 A | | 10/1998 | Ho |
| 6,055,366 A | * | 4/2000 | Le et al. |
| 6,117,179 A | * | 9/2000 | Tan et al. |

* cited by examiner

*Primary Examiner*—Charles Bowers
*Assistant Examiner*—Evan Pert
(74) *Attorney, Agent, or Firm*—Gerald E. Laws; W. James Brady, III; Frederick J. Telecky, Jr.

(57) ABSTRACT

In deep submicron technologies, coupling capacitance significantly dominates the total parasitic capacitance. This causes crosstalk noise to be induced on quiescent signals which could lead to catastrophic failures of transistor gate oxide. A methodology is provided that is a practical approach to full-chip crosstalk noise verification and gate oxide integrity analysis. A grouping based method is described for identification of potential victims and associated aggressors, using either timing information or functional information. Potential victim signal lines are selected and pruned based on total coupling capacitance to various signal groups. Selected signal lines are then fully simulated to determine gate oxide field strengths on transistors connected to the selected signal lines.

13 Claims, 8 Drawing Sheets

METHOD OF SIMULATION FOR GATE OXIDE INTEGRITY CHECK ON AN ENTIRE IC

CROSS REFERENCE TO RELATED APPLICATIONS

This application is related to co-assigned application Ser. No. 09/608,309 (TI-28044), filed contemporaneously herewith and incorporated herein by reference.

This application claims priority under 35 USC §119(e)(1) of Provisional Application No. 60/143,972, filed Jul. 15, 1999 (TI-29390PS) and Provisional Application No. 60/153,598, filed Sept. 13, 1999 (TI-28208P).

TECHNICAL FIELD OF THE INVENTION

This invention relates to methods for designing and fabricating digital integrated circuits, and in particular to simulation and analysis of the circuit design in order to detect and eliminate excessive electric field stress on gate oxide of the transistors comprising the digital circuits.

BACKGROUND OF THE INVENTION

Before an integrated circuit is fabricated, a trial design is analyzed by simulating the operation of the proposed circuits that are to be included within the integrated circuit. Simulation is used to verify correct functional operation of the circuit, as well as to verify correct dynamic timing operation. Gate oxide integrity (GOI) is becoming an increasingly important issue in ULSI reliability. Since the transistor dimensions are typically scaling faster than the supply voltages, the electric fields across the gate oxide are increasing. Excessive electric fields and/or defective gate oxides can lead to Time Dependent Dielectric Breakdown (TDDB) of the oxide.

Signal integrity is one of the key challenges in design and test, now and beyond 100 nm technologies. Rapid technology scaling is causing increased coupling capacitances due to reduced signal to signal spacing and increased distance from the substrate. Among several types of noise, crosstalk noise introduced due to parasitic coupling is predominant in digital designs. Interconnect parasitic coupling has two effects, at least. A first effect is on the delay due to different switching patterns and this affects the performance of the chip besides potential race conditions. A second effect is induced glitches or noise that could cause functional failure by switching logic-states. In the case of designs employing dynamic logic design styles, this problem is more severe due to increased noise sensitivities of pre-charged nodes. In the case of static logic, except for asynchronous signals such as reset/clear and clock nodes, a failure could result only when data inputs connected to storage elements are latched during the active phase of the clock.

Design complexities are increasing with system on chip (SOC) designs and increased length of interconnect at full-chip level is one of the major sources of crosstalk noise problem. This refers to integration of system level functions, for example, many functions in a cellular telephone integrated into one integrated circuit (IC). Typically, SOC designs have CPU cores, memory blocks, logic blocks and possibly analog design blocks, all on one chip. Dynamic simulation of large designs with millions of parasitics is computationally prohibitive; in order reduce computation loads, static noise verification is used. Magnitude of the parasitic coupling, behavior of victim drivers during noise injection and dependency between factors like timing and parasitic coupling are some of key challenges in noise verification.

A commonly used simulator for designing integrated circuits is SPICE, which is available from the University of California at Berkeley, via the Department of Electrica Engineering and Computer Sciences. However, a SPICE simulation of all the nets in an entire chip is far too complex to be practical.

In order to perform a SPICE simulation of a circuit, all of the nodes between every component in the circuit need to be numbered. Then those nodes, the type of components at each node, and the component magnitudes are entered into the SPICE program.

If the circuit which is being simulated is an entire integrated circuit chip, then the number of nodes and corresponding components which need to be entered into the SPICE program is overwhelming. Firstly, the number of nets may be 40,000 in a current typical integrated circuit design. Secondly, for each such net, about seventy discreet components need to be entered because in the actual chip, the net components are distributed. Specifically, each signal line has capacitance which is distributed throughout the line; and each signal line also has a resistance which is distributed throughout the line. To simulate these distributed components, each signal line needs to be represented by a RC ladder circuit which has about two dozen nodes; with each node having a resistor to the next node, a capacitor to ground, and a capacitor to any adjacent signal line.

After all of the nodes and corresponding components for all the nets are entered into the SPICE program, the program operates to determine the voltages which occur on each node in sequential increments of time. Typically, about 1,000 increments of ten picoseconds each are needed to obtain the entire voltage waveform on a node in one net in an integrated circuit chip. To determine the voltages for just one time increment the SPICE program repetitively solves a matrix equation which is of the form $[Y][V]=[1]$. Here, Y is an n-x-n matrix, V is an n×1 matrix, and I is an n×1 matrix; where n is the number of nodes in the circuit. Thus, for a single victim net with twenty aggressor nets, n is (24 nodes per net) ×(21 nets) or 504.

For each increment in time the SPICE program makes about five iterations before it converges on a solution. This iterative process is repeated for each of the subsequent time increments. Using a current state of the art workstation, it takes about ten minutes to perform a SPICE simulation of a single circuit which has 500 nodes and for which a solution is sought for 1,000 time increments. Such a circuit represents a typical victim net with twenty aggressor nets. Consequently, to simulate a chip which has 40,000 nets would take about 400,000 minutes, or more than 270 days to complete!

Accordingly, a primary object of the present invention is to provide a method of designing circuit chips by which the above problems are overcome.

Other objects and advantages will be apparent to those of ordinary skill in the art having reference to the following figures and specification.

SUMMARY OF THE INVENTION

Pruning to identify potential victims and associated aggressors forms a key aspect of the methodology of the present invention. In general, and in form the present invention, a method is provided for designing an integrated circuit which contains a plurality of signal lines in close proximity, such that capacitive coupling among the signal lines is operable to induce crosstalk on at least one of the signal lines. Parasitics are extracted from a trial layout of the integrated circuit, and the method further comprises the steps of: grouping the plurality of signal lines into a plurality of aggressor groups; pruning the plurality of signal lines to form a plurality of victim signal lines; building a minimum region network for each victim signal line of the plurality of victim signal lines comprising the respective victim signal line, aggressor signal lines associated with the respective victim signal line, and associated parasitics; simulating the operation of each minimum region network to determine an amount of noise induced on each respective victim signal line by the aggressor signal lines associated with the respective victim signal line, and analyzing the simulation results of each minimum region network to determine if a gate oxide integrity (GOI) violation exists.

In another form of the invention, an integrated circuit is fabricated according to the modified trial layout.

In another form of the invention, a computer system is provided which as a mass storage device that holds a design program for designing an integrated circuit according to the above described method.

These and other features of the invention that will be apparent to those skilled in the art from the following detailed description of the invention, taken together with the accompanying drawings.

DESCRIPTION OF THE DRAWINGS

Corresponding numerals and symbols in the different figures and tables refer to corresponding parts unless otherwise indicated.

DETAILED DESCRIPTION OF THE INVENTION

Aspects of the present invention include methods and apparatus for designing an integrated circuit. In the following description, specific information is set forth to provide a thorough understanding of the present invention. Well-known circuits and devices are included in block diagram form in order to not to complicate the description unnecessarily. Moreover, it will be apparent to one skilled in the art that specific details of these blocks are not required in order to practice the present invention. As discussed above, interconnect parasitic coupling has two effects, at least, that are important in the design of an integrated circuit. A first effect is on the delay due to different switching patterns and this affects the performance of the chip besides potential race conditions. The second effect is induced glitches or noise that could cause functional failure by switching logic-states. Methods for improving simulation results in view of the first effect is disclosed in co-assigned application Ser. No. 09/240,993 (TI-25003) entitled Method for Analyzing Circuit Delays Caused by Capacitive Coupling in Digital Circuits and is incorporated herein by reference. Methods described in '993 may be advantageously combined with methods described herein. A method for improving simulation results in view of the second effect is disclosed in co-assigned application Ser. No. 09/608,309 (TI-28044) entitled Practical Approach to Crosstalk Noise Verification of Static CMOS Designs and is incorporated herein by reference. Methods described in Ser. No. 09/608,309 (TI-28044) may be advantageously combined with methods described herein.

Figure 1:
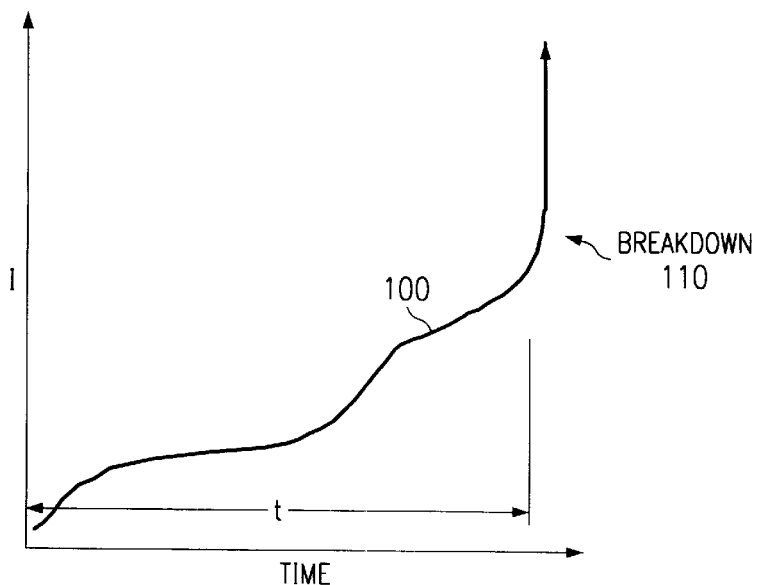
FIG. 1 is a plot illustrating the progression of time dependent dielectric breakdown (TDDB) for a constant voltage applied across a sample gate oxide.

Gate oxide integrity (GOI) is becoming an increasingly important issue in ULSI reliability. Since the transistor dimensions are typically scaling faster than the supply voltages, the electric fields across the gate oxide are increasing. Excessive electric fields and/or defective gate oxides can lead to Time Dependent Dielectric Breakdown (TDDB) of the oxide. FIG. 1 is a plot illustrating the progression of TDDB for a constant voltage applied across a sample gate oxide. After some period of time t, which may be days or years, leakage current through the oxide represented by plot line 100 will gradually increase until the oxide breaks down and a large current flows as indicated at 110, resulting in failure of the transistor. Fortunately, transistors may be increasingly tolerant of the larger electric fields due to the effects of band bending and poly depletion. It has now been discovered that at least two different instances of GOI stress should be evaluated during the design of an integrated circuit. A first situation involves transistors within internal circuitry of various modules, larger modules being referred to as megamodules, where GOI stress can result from signal line coupling. Parasitic capacitance between signal lines can lead to a significant disturbance on a static signal when the coupled signals transition, as discussed above. Rising aggressors can induce a supply overshoot on a static high signal, stressing the n-channel transistor gates connected to that signal. Likewise, falling aggressors can stress p-channel transistors for a static low signal. Another GOI concern is in the input/output (I/O) buffers of the integrated circuit due to voltage level shifting and ringing that can occur on bond wires or traces of the integrated circuit package. An embodiment of the present invention provides a methodology to quantify gate oxide stress that could occur during operation of an integrated circuit due to the above situations during the design phase of the integrated circuit, so that the design of the integrated circuit can be modified to avoid TDDB failures.

Figure 2:
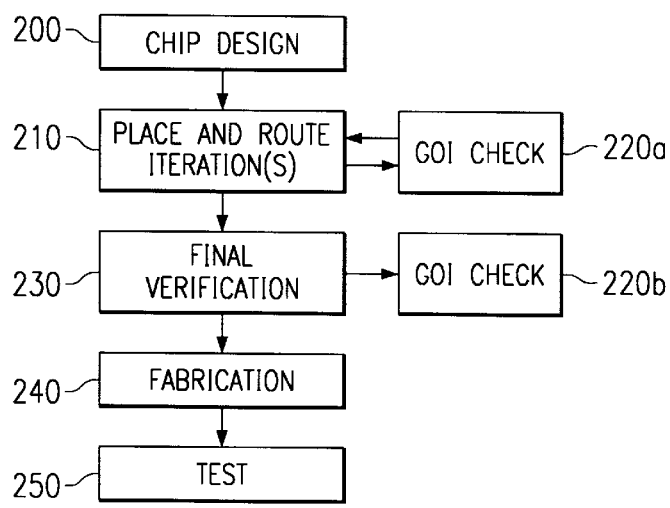
FIG. 2 is a flow chart which describes a process for designing and fabricating an integrated circuit (IC) according to aspects of the present invention.

FIG. 2 is a flow chart that describes a process for designing and fabricating an integrated circuit (IC) according to aspects of the present invention. In chip design step 200, the functional operation of the IC specified and a net list is created which defines interconnectivity of all of the function blocks of the IC using known design tools. Place and route step 210 creates a trial layout of the IC using known routing tools. Various simulation and analysis processes are also performed during this step using known simulation tools to verify that the trial design and layout meets the operational requirements of the IC. During step 210, one or more iterations may be performed on the net list and routing in response to deficiencies discovered during simulation and analysis in order to create a fully functional design. After all functional requirements have been satisfied in step 210, a final verification of the placement and routing is performed in step 230 using know verification tools. During this step, the layout is checked and corrected if necessary to remove design rule violations for the technology/process in which the IC will be fabricated. In fabrication step 240, the IC is fabricated using known processes. In test step 250, the completed IC is tested using known test techniques. According to an aspect of the present invention, a gate oxide integrity (GOI) check step 220a is performed in concert with place and route step 210. GOI step 220a may be performed a number of times corresponding to iterations of step 210. According to anther aspect of the present invention, GOI step 220b is performed in concert with verification step 230.

Figure 3:
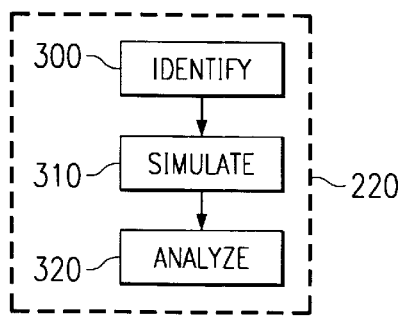
FIG. 3 is a flow chart showing a gate oxide integrity verification (GOI) step from FIG. 2 in more detail.

FIG. 3 is a flow chart showing GOI step 220 in more detail. Identify step 300 identifies a set of potential failure cases in the trial layout produced in routing step 210. Step 300 involves finding out the cases that could cause potential GOI violations. Step 300 filters down a large problem size, the entire IC database, into a manageable size for detailed verification. It is important to reduce the number of cases identified for time consuming detailed verification. Conversely, it is important that no cases that have actua GOI violations get missed during this filtering step. In one embodiment of the present invention, identification step 300 is implemented by the "FindVictims" too that is described later. FindVictims searches the netlist to find nets with significant parasitic coupling to nearby nets. Another embodiment may identify potential failure cases using other criteria, such as length of net, spatia proximity to another signal line, etc.

Still referring to FIG. 3, simulate step 310 simulates each of the cases identified in step 300 that could cause potential GOI violations. This step involves detailed simulation of the victim/aggressor clusters identified in step 300. The simulation could be based on standard electrica simulators such as SPICE or other advanced numerical techniques.

For example, a numerical technique such as AWE (Asymptotic Waveform Evaluation) or its variant could be used. This step produces voltage waveforms for the overshoot and undershoot on a victim signal line that can be further analyzed to determine the electric field strengths.

SPICE can be run for four cases:
Rising aggressors with static high victim (RH)
Falling aggressors with static high victim (FH)
Rising aggressors with static low victim (RL)
Falling aggressors with static low victim (FL)

Analyze step 320 analyzes the simulation results from step 310 to determine potential GOI violations. The RH and FL cases are of interest of GOI. This step involves computation of the electric field strength (Eox) across the gate oxide of each of the transistors identified in step 300 and determines if the electric field strength is above a threshold specified for the technology which will be used to fabricate the IC in step 240. The GOI flow runs a computation on the RH and FL results to determine the peak and DC effective electric fields in the gate oxide for any transistors connected directly to the victim net (output of the driver and input of the receivers). The peak Eox values are recorded in order to help characterize the Eox fields. One embodiment of the present invention uses GOI rules that only limit the DC effective Eox. However, other embodiments may use expanded GOI rules. Peak Eox and the DC effective Eox are calculated by using an equation which will be described later. This data is further processed by taking into account the cell type to determine if an actua GOI violation exists. In order to provide the gate-oxide-area / Eox relations, the flow keeps a running count of the gate oxide area for each Eox.

Table 1 defines several terms that are used throughout this document.

TABLE 1

Definition of Terms

| | |
|---|---|
| coupled | Refers to two nets with the capacitance between them modeled as a capacitor connected to the two nets of value equal to the capacitance between the nets. (also known as true C); |
| decoupled | refers to two nets with the capacitance between them modeled as two capacitors. Each capaciter has one terminal connected to GND and one terminal connected to each of the nets. The value of both capacitors is equal in value to the capacitance between the nets. The only time the values are different than the capacitance between the two nets is when coupling compensation is being performed: (also known as lump c) |
| distributed parasitics | refers to a net modeled as a network of resistors, capacitors, and/or inductors with possibly capacitance at each of the nodes in the net. |
| lumped parasitics | refers to a net or portion of a net where the resistance and inductance of the net are not modeled. In this case the capacitance would be lumped on a single node that would model a net or portion of a net. |
| net | a collection of electrically connected interconnect lines. |
| node | an electrical junction where one or more resistors/inductors are joined. Nodes may be added to a net when resistors/inductors are used to model the parasitics of the interconnect lines making up a net. |
| victim | a net that is being affected by transitions on a nearby aggressor net |
| aggressor | a net that is affecting the delay of the victim net. |

Figure 4:
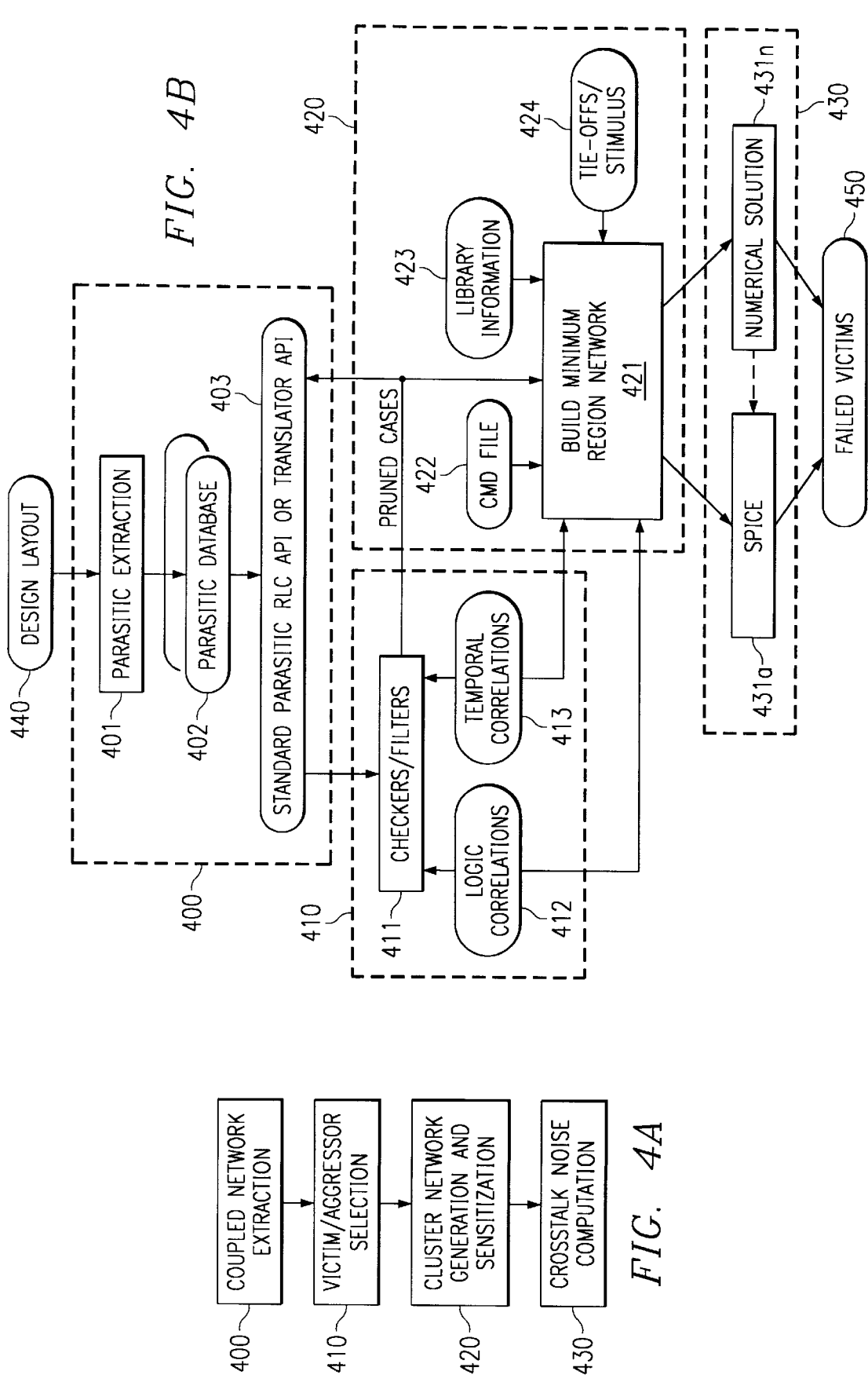
FIG. 4A illustrates a conceptual block diagram of a crosstalk verification methodology, according to aspects of the present invention.
FIG. 4B is a process chart illustrating the methodology of FIG. 4A in more detail.

Identification step 300 will now be described in more detail with reference to FIG. 4A. The identification methodology based on crosstalk described herein emphasizes pruning the totalnumber of nets in a proposed integrated circuit design to find potential victim clusters and to analyze these clusters independently. A victim cluster is a victim and it's associated aggressors. A conceptual flow diagram for this methodology is described in FIG. 4A.

Step 400, Coupled Network Extraction, involves detailed parasitic extraction of the entire design including all the coupled parasitics. Typically, this is the most time consuming portion as some form of quasi-3-D or 2.5D approach is used. Step 410, Victim/Aggressor Selection, involves identification of potential victims and associated aggressors. Both spatial and temporal correlations are typically used in this process. This reduces the problem space and helps focus on potential problems.

Figure 6:
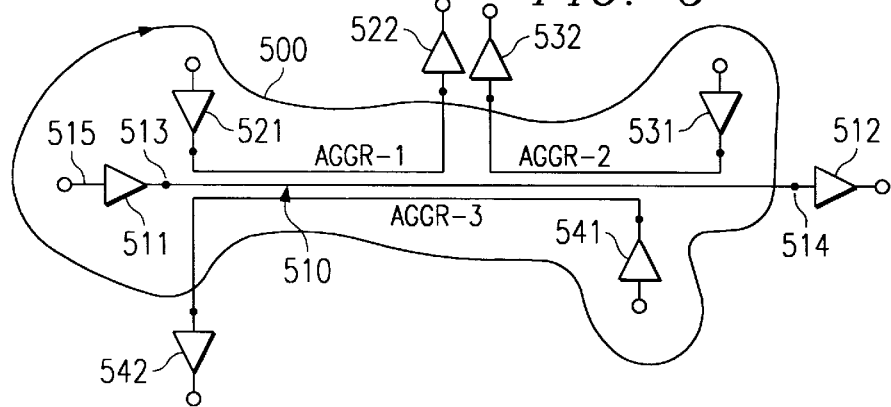
FIG. 6 illustrates a minimum-region network.

Step 420, Cluster Network Generation and Sensitization, involves building a "minimum region network" which constitutes the victim, aggressors and associated R(L)C parasitics. Minimum region networks could be as simple as only the channel connected components, i.e., the source/drain connected transistors that make up the output stage of a driver, or can include complete drivers for victims/aggressors as shown in FIG. 6.

Step 430, Crosstalk Noise Computation, involves actual crosstalk noise computation and checking for noise propagation. This is typically done using analytical models or some form of electrical simulation. Techniques for reduced order modeling of parasitic networks is known and are helpful in reducing computation times. Failure is typically determined based on noise margins of the victim receivers and using set-up time information from timing analysis.

FIG. 4B is a process chart illustrating the methodology of FIG. 4A in more detail. A trial layout of an integrated circuit design is completed in step 440, using known layout tools. In step 400, a parasitic extraction step 401 produces a parasitic database 402 that is translated for use by other simulation modules by translation step 403. In step 410, filter step 411 makes use of logic correlation step 412 and temporal correlation step 413 to identify potential victim nets and associated aggressor nets. In step 420, a minimum region network is built in step 421 using command file information 422, and library information 423. Since a minimum region net is truncated from the rest of the circuitry, tie-off schemes and stimulus models are provided in step 424. In step 430, various analytical models, such as Spice 431a, or other reduced order modeling tools 431n are used to simulate crosstalk noise and to check for noise propagation. In step 450, victim nets which are susceptible to crosstalk noise are identified based on the results of step 430.

Figure 5:
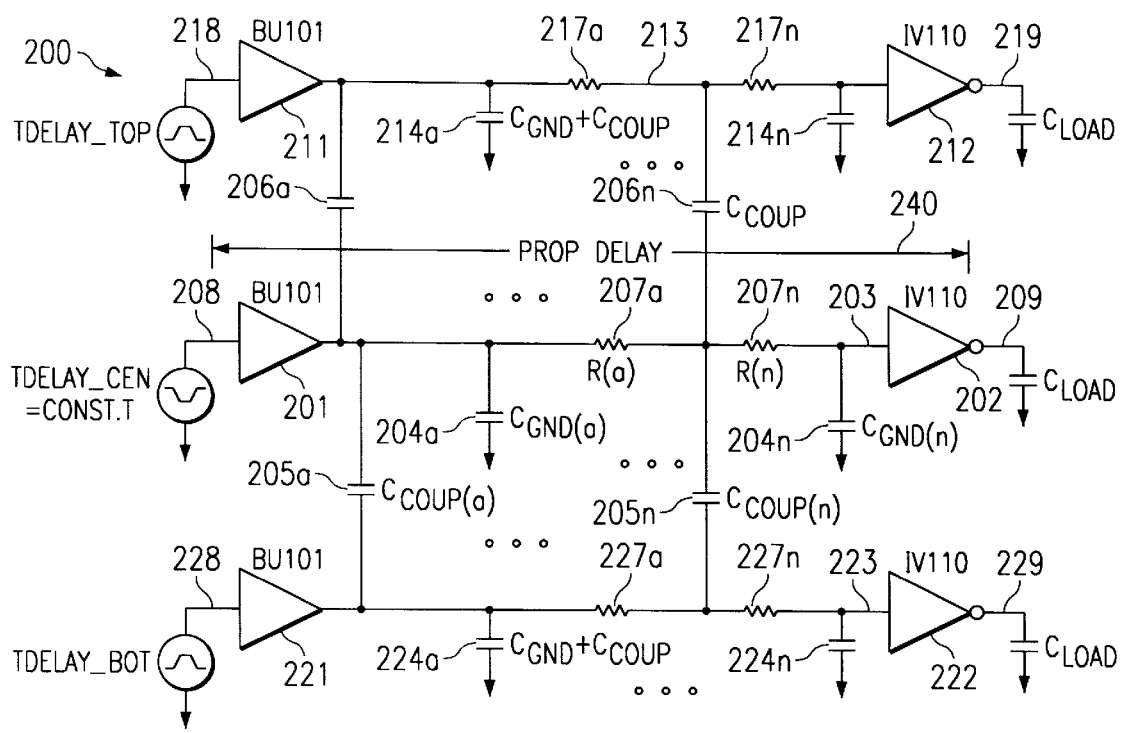
FIG. 5 is a coupled simulation mode for determining propagation delay and noise induction in a signal line influenced by signal transitions on adjacent signal lines, according to an aspect of the present invention.

FIG. 5 is a coupled simulation mode 200 for determining propagation delay and noise induction in a signal line influenced by signal transitions on adjacent signal lines using parasitic values extracted in extraction step 400, according to an aspect of the present invention. Simulation mode 200 is a fully distributed mode so that effects of signal coupling can be correctly modeled. Signal line 203 which is referred to as a "victim net" is modeled as a set of capacitors 205a–n to ground and a set of resistors 207a–n in series. Signal line 213 and signal line 223 represent signal lines routed adjacent to victim net 203. These are referred to as "aggressor nets." Both aggressor nets are also modeled as a set of distributed capacitors and resistors. However, the values of distributed capacitors 214a–n are scaled to account for coupling capacitance between aggressor net 213 and another signal line adjacent to it. Likewise, the values of distributed capacitors 224 a–n are scaled to account for coupling capacitance between aggressor net 223 and another signal line adjacent to it.

Still referring to FIG. 5, coupling capacitance between victim net 203 and aggressor net 213 is modeled as distributed capacitors 206a–n. Likewise, coupling capacitance between victim nets 203 and aggressor nets 223 is modeled as distributed capacitors 205a–n.

Still referring to FIG. 5, a series of SPICE simulations can be preformed in which the time at which input signals to the aggressor nets switch on lines 218 and 228 is varied with respect to the time at which an input signal to the victim net on line 208 switches to determine a worst case propagation delay 240. However, with current computer systems, it is impractical to perform such a series of SPICE simulations, or other similar types of simulators, using distributed models on every possible victim net in an integrated circuit.

FIG. 6 is an illustration of a minimum-region network. As discussed above, a minimum region network can be as simple as the channel connected components or can include complete drivers for victims/aggressors. Minimum region network 500 includes victim signal 510 and victim driver 511, along with aggressor signals Aggr-1, Aggr-2 and Aggr-3 and corresponding aggressor drivers 521, 531, and 541. A minimum region network is typically reduced to smaller networks for increased computing efficiency in step 406 by truncating victim receiver 512 and aggressor receivers 522, 532, and 542; however, victim receiver 512 could also be included to verify propagation of noise for accurate delay. A Driving Point Admittance (DPA or pi-model) is sufficient to be used for victim receiver output load to analyze noise propagation.

One of the major contributors to faster signal integrity verification at gate level is use of a simplified mode for the driver instead of transistor level description. However, a resulting error in simulated crosstalk noise could be significant as the victim driver is essentially not making a rail-to-rail transition. Error due to driver modeling can be easily quantified using a simple controlled evaluation model, similar to FIG. 5. In this evaluation model, parasitics such as resistance, coupling capacitance and capacitance to ground are parameterized to enable evaluation for different technology nodes. By using different drive strengths and different types of cells for aggressors and victim drivers, it can be easily seen that using linearized models for drivers can result in significant errors as high as 50% in the region of crosstalk failure. A method to obtain simplified non-linear drivers and reduction in error is described in "Chip-Level Verification of Parasitic Coupling Effects in Deep Sub-micron Digital Designs," was noted earlier and is incorporated herein by reference.

Figure 7:
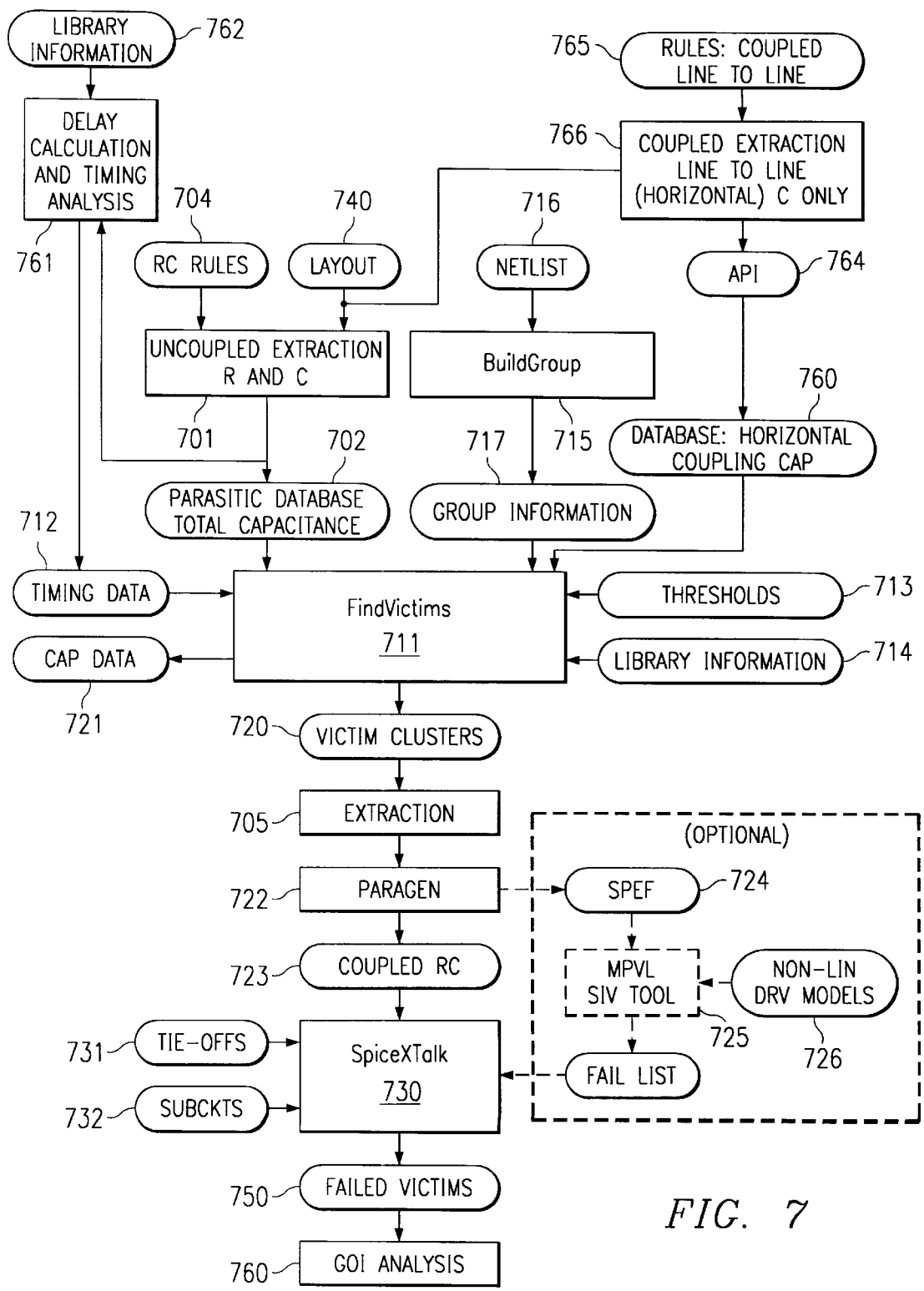
FIG. 7 is a process diagram illustrating the methodology of FIG. 4A and FIG. 4B in more detail.

FIG. 7 is a process diagram illustrating the methodology of FIG. 4A and FIG. 4B in more detail. A trial layout of an integrated circuit design is completed in step 740, using known layout tools. A parasitic extraction step 701 produces a parasitic database 702. Various tools for parasitic extraction are known to those skilled in the art, such as "maskPE". Parasitic extraction step 701 is based on empirical equations for parasitic capacitance. Interconnect process parameter rules 704 for metal and dielectrics that yield maximum capacitance within specified parameter limits of the selected process are used for extraction. A flat extraction method is used to account for all the interconnect interactions in various levels of interconnect hierarchy. On complex IC designs, such as digital signal processor (DSP) core, a complete coupled parasitic extraction is performed. In order to address capacity issues for full-chip verification, a two-pass parasitic extraction is used. The first pass performed in step 766 extracts coupled line-to-line parasitic capacitances, which includes only horizontal components. A second pass performed in step 701 extracts uncoupled parasitic capacitance and resistance, which includes both horizontal and vertical components. This provides 10–20×reduction in number of devices extracted as compared to a complete coupled RCL extraction. This is motivated by the fact that in deep sub-micron (DSM) technologies, metal lines are becoming taller and thinner which increases the lateral component of the capacitance. Typically, designs implemented in technologies below 0.5 micron are referred to as DSM designs. Currently, 0.18 u and 0.13 u are some of the leading edge technologies. Crosstalk becomes a more significant issue in DSM designs. A tabulation of capacitance data, such as Cg (Capacitance to ground), Cc (Coupling capacitance), Ctot (Total capacitance), and percentage coupling to total capacitance (PCCT) is determined for every signal and saved in capacitance database 721.

Since the victim pruning methodology, described later in this section, is based on ratio of coupling capacitance to total capacitances, error introduced in pruning is minimal when total capacitance from parasitics back-annotation is used. Error can also be reduced by using reduced thresholds for pruning. A second-pass extraction in step 705 includes detailed RCs for all of the victims/aggressor clusters chosen in filter step 711.

Selection of potential victims and their associated aggressors is a crucial step in the crosstalk verification methodology according to an aspect of the present invention, which is performed in FindVictims filtering step 711. Pruning efficiency is extremely important to reduce the crosstalk noise computation time, while not missing victims. A concept of grouping is used to perform victim/aggressor selection. A group is defined as a set of signals that could switch at the same time and hence collectively induce a glitch on a victim that is larger than if the aggressors switched at dispersed times.

Timing information 712 can be obtained from commercial timing analyzers such as Pearl(Cadence) and PrimeTime (Synopsys).

Figure 8:
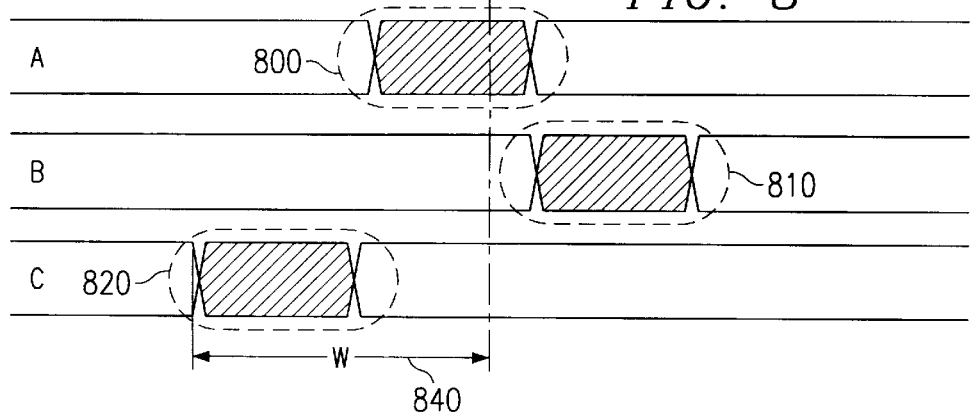
FIG. 8 is a timing diagram illustrating switching events on three coupled signals.

As an example, refer to FIG. 8, which is a timing diagram illustrating switching events 800, 810 and 820 on three coupled signals A, B, and C, respectively. Each switching event includes a range of signal transitions representative of high to low, low to high, best case and worst case timing. In FIG. 8 for glitch analysis, if a victim signal is latched by down-stream circuitry in response to a clock edge shortly after it stabilizes, then it must be stable for a specified set-up and hold-time before and after the clock edge, respectively. Coupled aggressor signals which have switching events during the set-up and hold-time period of a victim signal may induce noise on the victim during this critical period which can cause a failure, thus such a signal would be classified as an aggressor signal. Conversely, switching events which occur on a coupled signal before the victim signal has switched and stabilized would not cause a failure and are therefore not classified as aggressor signals. Thus, for signal A, only B can be an aggressor, for signal B, neither A or C can be aggressors and for signal C, both A and B are aggressors. For a given victim, all the aggressors that switch after the victim has settled are grouped. All signals for which timing information does not exist are grouped as an asynchronous (ASYNC) group and are always treated as aggressors. Ultimately, a victim window may be selected as all time greater that the earliest required setup time to all down stream latches.

Referring again to FIG. 8 for delay calculation, a timing window can also be associated with a potential victim signal to allow pruning of potential aggressor signals which do not have transitions within the window of a victim. For example, window 840 has a width W and is associated with signal C. If a potential aggressor signal does not transition within the window, it is excluded from delay analysis. In this case, signal A would be classified as an aggressor to C, but signal B would be excluded from being an aggressor to C.

Referring again to FIG. 8, if a victim signal is not latched by clock signal, but is instead received by dynamic circuitry, for example, then timing information is evaluated in a different manner, since noise induced crosstalk could trigger a dynamic circuit anytime after the circuit has been precharged. Therefore, in FIG. 8, for signal A, signals B or C could be classified as aggressors in a dynamic circuit. Likewise for signal B, signals A and C could be classified as aggressors, depending on pre-charge timing.

Figure 9A:
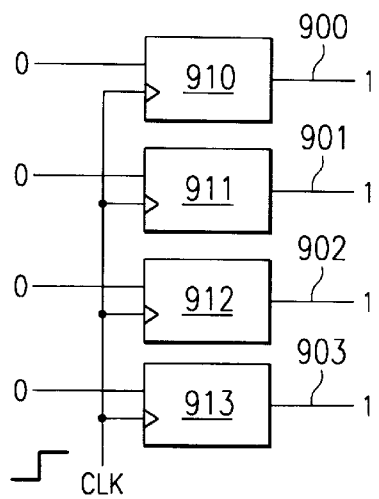
FIGS. 9A and 9B are schematic diagrams of examples of grouping without timing information.
Figure 9B:
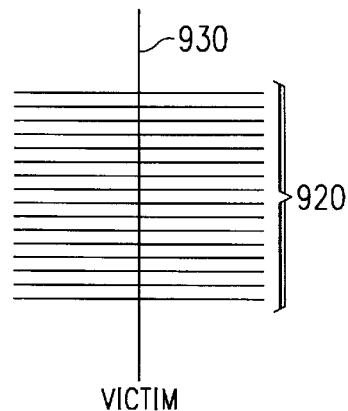

FIGS. 9A and 9B are schematic diagrams of examples of grouping without timing information. Grouping can also be used when timing information is not available. For example, referring to FIG. 9A, signals 900–903 from a set of flip-flops 910–913 which are clocked by the same clock signal CLK are considered as a group, since all the flip-flop outputs could potentially switch at the same time. Similarly, referring to FIG. 9B, a set of signals in a bus 920 is considered as a group since bits of the same bus could potentially switch at the same time; this is referred to as name based grouping, or function based grouping. As shown in FIG. 9B, a signal 930 crossed over by bus 920 could be a potential victim even though crossover coupling capacitance to each individual bus signal is small.

As another example, all the signals that are strictly static, such as those tied to tie-off cells, are grouped to signify that they can never be aggressors. Many different types of groups can be identified based on operating characteristics of a given IC. One skilled in the art may identify additional groups which could have significant crosstalk impact on coupled victim signals in accordance with aspects of the present invention, given the preceding examples.

Referring again to FIG. 7, groups of signals are identified in BuildGroup step 715 using netlist information 716, as described above. Netlist information 716 includes a list of all of the nets in a given IC design and their connectivity to circuits in the design. Each group is categorized with relevant group information in step 717. Once the groups of signals are identified, potential victims and their associated aggressors are determined in filter step 711 as follows. For a potential victim signal, if $C_c$ is the total coupling capacitance to a potential aggressor signal or to a potential aggressor group, $C_g$ is the total capacitance to ground and $C_p$ is the total pin capacitance of the receiver input pins, then total capacitance for that potential victim signal $C_t$, is $C_c+C_g+C_p$. For N potential aggressor signals or potential aggressor groups, a given signal is a victim if its cumulative percentage coupling with respect to total coupling (PCCT) is greater than a selected group threshold; that is, if $$\frac{\left(\sum_{i=j}^{N} C_{c_i}\right)}{C_t} \geq p_g$$

where $p_g$ is a group percentage threshold value for PCCT. To control the number of individual aggressors that have very small percentage coupling on their own and thereby reduce the computation burden, a signal percentage threshold $p_s$ is selected (default value 0). For a given victim, an individual signal or group of signals from among the N groups of signals is an aggressor if its PCCT is greater than $p_s$; that is, if $$\frac{C_{c_i}}{C_t} > p_s.$$

Threshold values are selected in threshold step 713. It has been determined that using a value of 1% for $p_s$ provides good results. For a given IC design, threshold values may be selected based on the type of circuit a potential victim signal is associated with, such as a dynamic circuit or a clocked circuit. Thresholds may be raised or lowered, based on the noise immunity of the circuit technology.

When timing information is available, the number of groups can be considered as two, where the first group satisfies timing requirements to be aggressors and the second group contains asynchronous signals.

In order to determine total coupling capacitance between a potential victim signal and each group of potential aggressor signals, a matrix of signal to signal coupling can be formed, based on capacitance database 721. Alternatively, instead of building matrix of signal to signal coupling (which could be really huge, e.g., $10^{10}$ combinations for 100K signals), capacitance data 721 can be streamed out on a per signal basis such that all C parasitics associated with a signal are listed exclusively in one delineated group.

Additional filtering can be performed in filter step 711. For example, drive strengths can be incorporated as a filtering step, with appropriate thresholds selected in threshold step 713. However, a high degree of non-linearity in crosstalk waveforms complicates the use of drive strength thresholds. Another threshold based on total $C_c$ can be selected in threshold step 713 and used to eliminate short signals. Advantageously, cumulative percentage coupling, $p_g$, provides a conservative metric for crosstalk noise. Filtering based on spatial proximity can also be performed, for example.

Still referring to FIG. 7, after all of the victim signals are identified in filter step 711, victim clusters are defined in step 720, as described previously with respect to building a minimum region network. For each victim, an RC network similar to FIG. 5 in the form of a coupled RC network is generated by a parameter generation (paragen) step 722. Paragen 722 reads parasitic database 702 and then outputs a set of coupled RC networks 723. Alternatively, paragen 722 can output the minimum region networks as a SPEF dataset 724, where SPEF is Standard Parasitic Exchange Format, an IEEE standard format for representing parasitics.

Due to the accuracy issues involved in modeling of drivers, SPICE is used as the basic method to compute crosstalk noise in step 730. Sensitization vectors generated from library characterization data 731 is used to sensitize the aggressors and victims. Essentially, this data specifies how the input pins of cells in a minimum network should be tied to create a known output state. SPICE models for cells such as inverters, gates, etc, are obtained from sub-circuit database 732. An assumption that all the aggressors switch at the same time and in the same direction results in worst-case crosstalk. This is the normal mode of operation that enables worst-case analysis. In an embodiment of the present invention, all the inputs of a cluster are made to switch at the same time and the time difference between the outputs are measured. If the time difference between outputs are significantly large, then input arrival times can be changed to align all output transitions. Advantageously, switching windows can be used to reduce pessimism.

Alternatively, a faster crosstalk analysis solution based on MPVL, a commercially available Signal Integrity Verification (SIV) tool, is performed in step 725 using non-linear driver models 726 for aggressors and receivers. This can be used as an additional filter for crosstalk computation. Benchmarks of MPVL solution on just an RC network has shown a maximum error of 1% as compared to SPICE.

Networks having crosstalk noise violations are tabulated in step 750. In response to a detected crosstalk noise violation, the design of the IC can be modified to eliminate the violation by changing wire spacing or by insertion of repeaters in the victim signal, for example.

Advantageously, networks having crosstalk noise violations can also be analyzed in more detail in GOI analysis step 760 to determine if GOI violations exist, according to an aspect of the present invention. Furthermore, different pruning thresholds can be selected for use during FindVictims step 711 when a GOI analysis is going to be performed, than when only a crosstalk analysis is going to be performed in order to widen or narrow the scope of GOI analysis.

Figure 10:
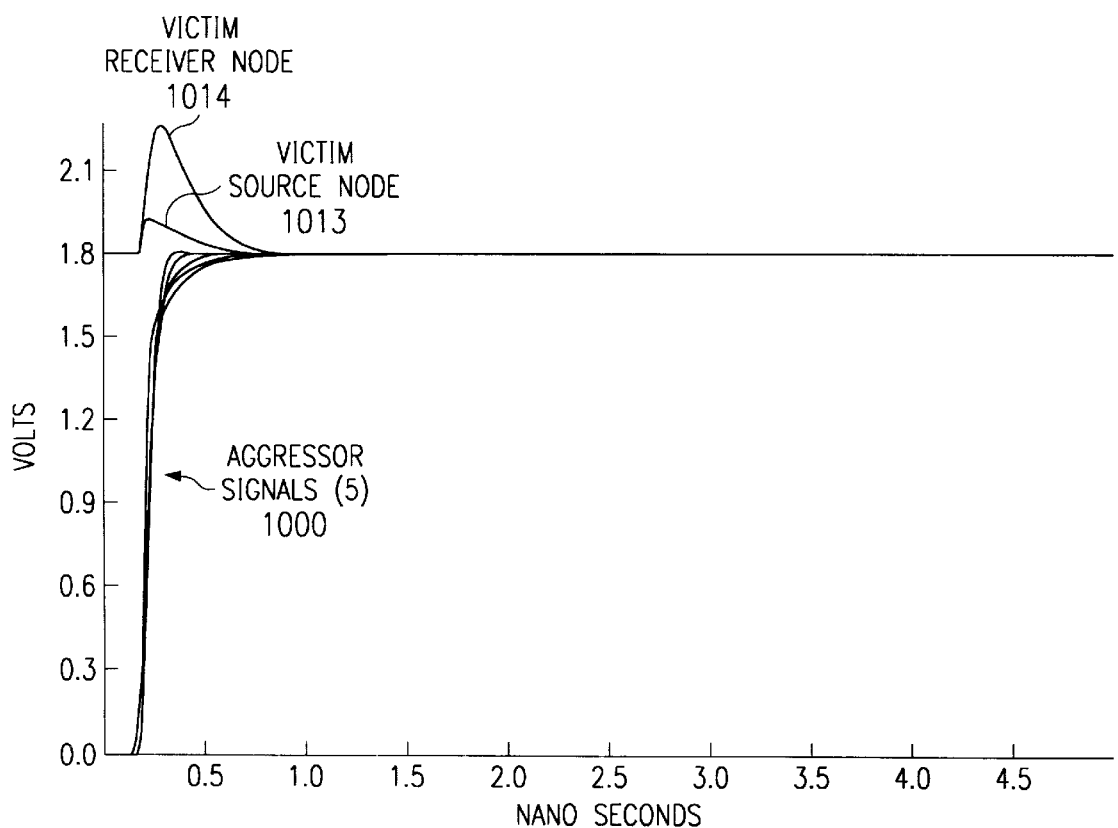
FIG. 10 is a timing diagram illustrating waveforms of a net with a victim and several aggressor signals, such as illustrated in FIG. 6.

FIG. 10 is a timing diagram illustrating waveforms of a net with a victim and several aggressor signals 1000, such as illustrated in FIG. 6. As previously stated, for GOI analysis, RH and FL result from SpiceXTalk step 730 are most indicative. FIG. 10 illustrates the RH case, where victim source node waveform 1013 represents a high signal at source 513 and victim receiver node signal 1014 represents a corresponding signal at receiver node 514. Aggressor signals 1000 are transitioning in a rising direction. Note that the rising aggressors have induced a glitch at the victim source node 513 and a larger glitch at the victim receiver node 514. Similar waveforms result for a low victim signal with aggressor transitions in a falling direction. To simplify the following description, the RH case of a single victim cluster as illustrated in FIG. 6 and FIG. 10 will be referred to, but a full GOI analysis includes both the RH and FL cases on each victim cluster determined by FindVictims step 711.

Figure 11:
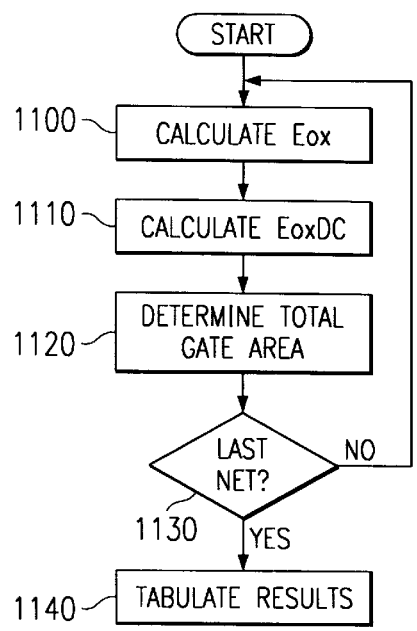
FIG. 11 is a flow chart illustrating the GOI analysis step of FIG. 10 in more detail.

FIG. 11 is a flow chart illustrating GOI analysis step 760 in more detail. Analysis of internal module signals will now be described, while I/O signals will be discussed later. This analysis is performed using a script that accesses and manipulates the results of SpiceXTalk step 730. The GOI script runs a computation on the RH and FL results to determine the peak and DC effective electric fields in the gate oxide for any transistors connected directly to the victim net, e.g. output of driver 511 and input of receiver 512. The peak Eox values are recorded in order to help characterize the Eox fields. Every voltage waveform in the SPICE deck is checked by the GOI script, but those which are not source or load nodes, as indicated by the netlist, for the victim are filtered out.

In Eox step 1100, a peak Eox for a victim signal is calculated by dividing the peak instantaneous voltage determined by SPICE in step 730 by the gate oxide thickness of transistors connected to the victim signal line:

$$EoxPeak = Vpeak/Tox$$

EoxDC step 1110 calculates a DC effective Eox for the victim net by using the following equation:

$$EoxDC = \frac{1}{Beta} \ln\left[\frac{\frac{1}{BitTime}\int_{time}^{time+BitTime} e^{(Beta*Vsig/Tox)}}{2} + \frac{e^{(Beta*Vdd/Tox)}}{2}\right]$$

The BitTime term is used as in SPICE, to indicate half of the smallest possible signal period. Each bit time in the waveform determined during the SpiceXTalk step 730 for the victim signal is checked to find the highest Eox. The second term in the equation simulates a quiet second half of the signal period. This is included to cover two worst case assumptions:

1) The highest DC effective Eox is seen when the aggressors transition every bit time. This yields the shortest quiet time on the victim.

2) The highest DC effective Eox is seen when the RL or FH transitions do not affect the victim. This could be because the transitions are not concurrent.

Eox stress for p-channel devices are based on the difference between the supply voltage and the signal voltage (Vdd–Vsig) since the bulk terminal is at Vdd. The GOI analysis script performed by steps 1100 and 1110 reports the signal name, the affected transistors (n-channel or p-channel), and the peak and DC effective Eox for each signal.

The script next determines the area of gate oxide affected by each victim signal in area step 1120 by looking up the cell type and port in a file which lists the gate-area (as determined from the SPICE decks) for each port of the macros. The instance and port information are contained in the signal name. If either the cell type or gate area cannot be found, or if there is no affected gate area, the signal will be skipped and a warning message printed.

The gate areas for each peak Eox and for each DC effective Eox are summed together, respectively. In case the samecsignal shows up multiple times, the script accounts for this by keeping track of the signal-load pairs processed and their Eox values. If a signal-load pair is repeated with a larger Eox value, the new value is used. The gate area is subtracted from the area count of the lower Eox and added to the higher Eox area count. This step is done independently for both the peak and DC effective stresses.

Step 1130 determines when the last victim net selected by FindVictim step 711 has been processed.

Tabulation step 1140 summarizes and present the results for review. The script outputs three sets of results. The first is a visual trace to a screen in the design system which lists the signal, instance, cell, port, gate area, DC effective Eox, and peak Eox for each signal with a DC effective Eox greater than 4.5 Mv/cm. A final tally of the affected gate oxide areas is given at the end of the run. The trace also shows warnings or errors in the run. Table 2 is an example of the results for the signal shown in FIG. 10.

TABLE 3

Sample Control File

```
# Sample control file
  #
  # Example:
  # VDD 1.95
  InstInfo    <path to the inst_info file>
  Areas       <path to file with gate-areas for macros>
  netlist     <path to the comprehensive netlist file>
  Hist        <name for gate-area/Eox table output files>
  Excel       <name for complete gate-area/Eox list output files>
  Script      <name for script to be created>
  VDD         <supply voltage for SPICE simulations (V)>
  GND         <ground voltage for SPICE simulations (V)>
  Thresh      <floor value for Eox (Mv/cm)>
  ToxN        <oxide thickness of N-channel xtors (m)>
  ToxP        <oxide thickness of P-channel xtors (m)>
  BitTime     <bit time for SPICE simulations (sec)>
  Beta        <beta value for GOI rule checking (cm/Mv)>
  Limit       <Eox divisions for gate-area limits in order >
  Limit       <from smallest Eox to largest allowed Eox >
  Limit       <Values should be in Mv/cm >
  Limit       < >
```

Figure 12:
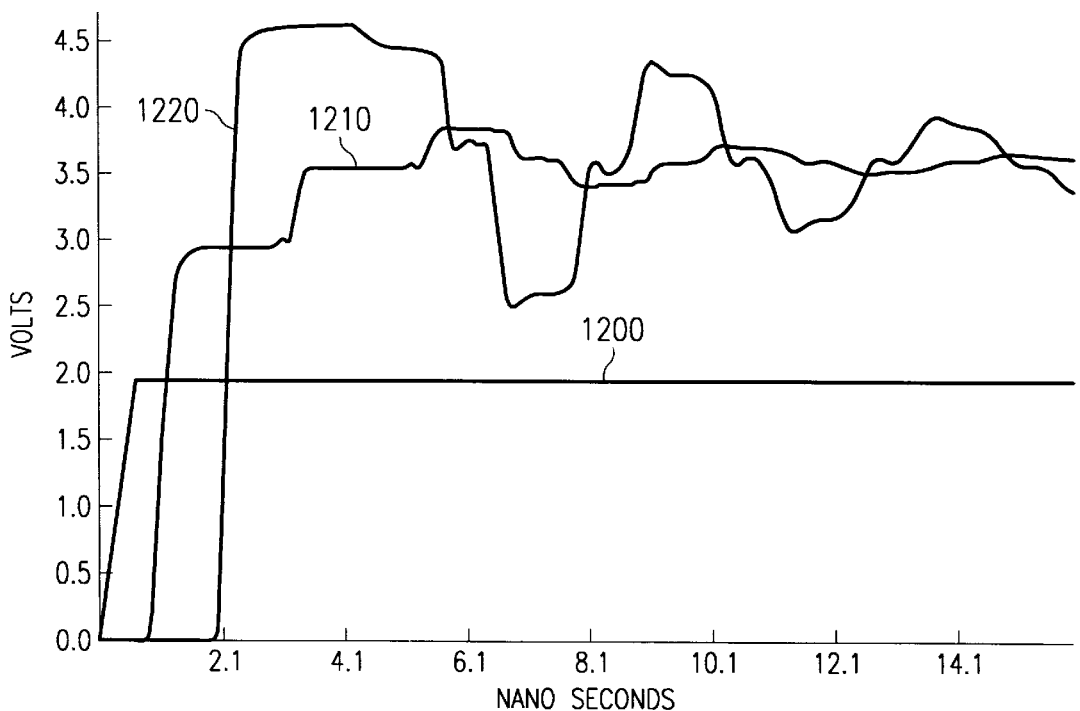
FIG. 12 is a timing diagram illustrating the effect of transmission line characteristics on a victim signal.

FIG. 12 is a timing diagram illustrating the effect of transmission line characteristics on a victim signal, assuming a 40 ohm transmission line environment and a transmission line propagation time of 1 ns. Referring again to FIG. 6, if a victim signal 510 is analyzed as a transmission line, then for an input signal 1200 applied to driver input 515, an output signal 1210 is formed at driver node 513 and a received signal 1220 is formed at receiver node 514. Due to the typically longer lengths of I/O signal lines, the SPICE runs contain the actual modeled package parasitics, plus a transmission line terminated with another IO buffer. The results are based on the highest Eox for all the traces in the package model. For the I/O buffers, all transistors are checked due to potential Eox from voltage level shifting. SPICE is run at the strong frequency for the IO signals, plus the strong frequencies for the output clock signals. Again, the simulations are based on two bit times, but in this case the first bit time is a transition and the second is static. The following equation is used in EoxDC step 1110 for I/O nets:

TABLE 2

GOI Analysis Result Example

Signal: control1_decode1_U182_y
Load: VDATAPATH1.RLDST.DAU.DW_D_PADDER32_I0.DB_INV_C_I0.IN0
Inst: DATAPATH1.RLDST.DAU.DW_D_PADDER32_I0.DB_INV_C_I0
Receiver: DB_INV_C
Port: IN0
Gate Area: 1.050
EoxDC: Nch 4.941438
EoxPk: Nch 5.970432

The second set of results is a pair of files containing the gate area for every individual peak Eox and DC effective Eox. The third set of results is a pair of files with the gate area for specified ranges of peak Eox or DC effective Eox. This pair of files can be used to compare gate areas to the gate-oxide-area/Eox tables or for histogram information. The divisions can be set in the control file of the GOI analysis script.

A special file containing the gate areas for the transistors in the macro cells must be created prior to running this flow. The format for this is as follows (areas are in $\mu/m^2$):

<Cell name><port signal><total n-channel transistor area for
signal><total p-channel transistor area for signal>

Also, the script expects a control file containing the location of input files, the process parameters, and the analysis conditions. A sample control file is show in Table 3. The "limit" values depend on the technology used for a given IC and proper selection of such design rules is beyond the scope of this disclosure. In the embodiment discussed herein, a limit of 4.5 mv/cm is selected for EoxDC. It has been determined that short term transient overshoots are acceptable provided the equivalent DC limit is not exceeded.

$$EoxDC = \frac{1}{Beta} \ln\left[\frac{1}{BitTime}\int_{time}^{time+BitTime} e^{(Beta*Vsig/Tox)}\right]$$

Figure 13:
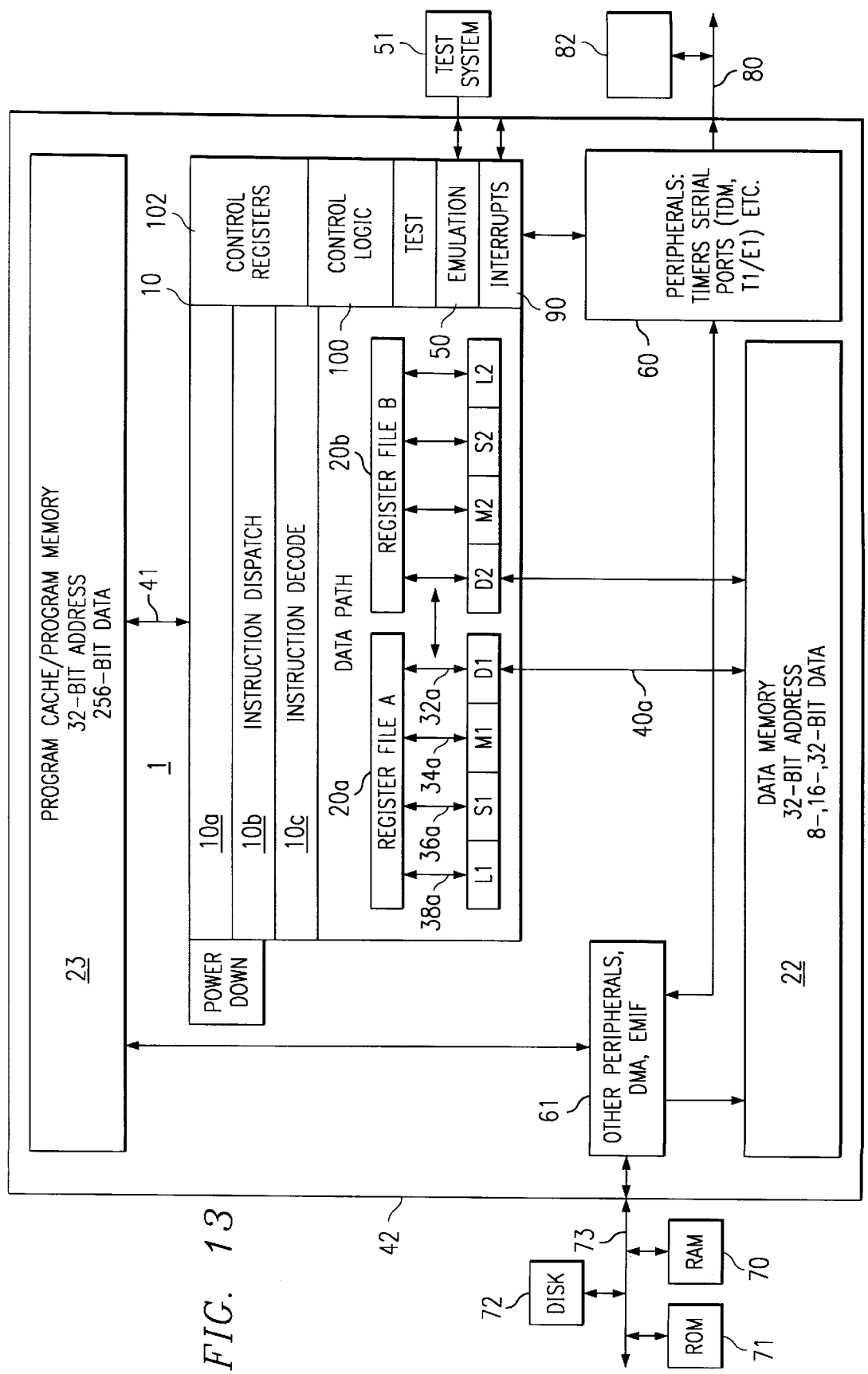
FIG. 13 is a block diagram of an integrated circuit that is designed and fabricated according to aspects of the present invention.

FIG. 13 is a block diagram of a microprocessor 1, which can be designed using aspects of the present invention. Microprocessor 1 is a-VLIW digital signal processor ("DSP"). In the interest of clarity, FIG. 1 only shows those portions of microprocessor 1 that are relevant to an understanding of an embodiment of the present invention. Details of general construction for DSPs are well known, and may be found readily elsewhere. For example, U.S. Pat. No.

5,072,418 issued to Frederick Boutaud, et all, describes a DSP in detail and is incorporated herein by reference. U.S. Pat. No. 5,329,471 issued to Gary Swoboda, et all, describes in detail how to test and emulate a DSP and is incorporated herein by reference. Details of portions of microprocessor 1 relevant to an embodiment of the present invention are explained in sufficient detail hereinbelow, so as to enable one of ordinary skill in the microprocessor art to make and use the invention.

In microprocessor 1 there are shown a central processing unit (CPU) 10, data memory 22, program memory 23, peripherals 60 and an external memory interface (EMIF) with a direct memory access (DMA) 61. CPU 10 further has an instruction fetch/decode unit 10a–c, a plurality of execution units, including an arithmetic and load/store unit D1, a multiplier M1, an ALU/shifter unit S1, an arithmetic logic unit ("ALU") L1, a shared multiport register file 20a from which data are read and to which data are written. Decoded instructions are provided from the instruction fetch/decode unit 10a–c to the functional units D1, M1, S1, and L1 over various sets of control lines which are not shown. Data are provided to/from the register file 20a from/to to load/store units D1 over a first set of busses 32a, to multiplier M1 over a second set of busses 34 a, to ALU/shifter unit S1 over a third set of busses 36a and to ALU L1 over a fourth set of busses 38a. Data are provided to/from the memory 22 from/to the load/store units D1 via a fifth set of busses 40a. Note that the entire data path described above is duplicated with register file 20b and execution units D2, M2, S2, and L2. Instructions are fetched by fetch unit 10a from instruction memory 23 over a set of busses 41. Emulation unit 50 provides access to the internal operation of integrated circuit 42 which can be controlled by an external test system 51.

Note that the memory 22 and memory 23 are shown in FIG. 11 to be a part of a microprocessor 1 integrated circuit, the extent of which is represented by the box 42. The memories 22–23 could just as well be external to the microprocessor 1 integrated circuit 42, or part of it could reside on the integrated circuit 42 and part of it be external to the integrated circuit 42. Also, an alternate number of execution units can be used.

When microprocessor 1 is incorporated in a data processing system, additional memory or peripherals may be connected to microprocessor 1, as illustrated in FIG. 11. For example, Random Access Memory (RAM) 70, a Read Only Memory (ROM) 71 and a Disk 72 are shown connected via an external bus 73. Bus 73 is connected to the External Memory Interface (EMIF) which is part of functional block 61 within integrated circuit 42. A Direct Memory Access (DMA) controller is also included within block 61. The DMA controller is generally used to move data between memory and peripherals within microprocessor 1 and memory and peripherals which are external to microprocessor 1.

As discussed earlier, with technology scaling, crosstalk noise has become a problem in a DSM design such as integrated circuit 42. Unlike timing problems, crosstalk noise could manifest only intermittently when certain combinations of signal switching are satisfied. Such failures could happen in the end-application as testers fail to detect them during product qualification. An aspect of the present invention advantageously provides a practical method to perform static noise verification on integrated circuit 42 in order to uncover GOI violations before it is fabricated. Advantageously, pruning methods based on grouping enables better coverage of potential victims and their associated aggressors, even in absence of timing. For example, buses such as 32a, 34a, 36a 38a, 40a and 41 can be grouped for victim pruning. Advantageously, timing-based pruning generally reduces pessimism around 30%; required timing information can be determined for integrated circuit 42 using simulation.

Several example systems which can benefit from aspects of the present invention are described in U.S. Pat. No. 5,072,418, which was incorporated by reference herein, particularly with reference to FIGS. 2–18 of U.S. Pat. No. 5,072,418. A microprocessor incorporating an aspect of the present invention to improve performance or reduce cost can be used to further improve the systems described in U.S. Pat. No. 5,072,418. Such systems include, but are not limited to, industrial process controls, automotive vehicle systems, motor controls, robotic control systems, satellite telecommunication systems, echo canceling systems, modems, video imaging systems, speech recognition systems, vocoder-modem systems with encryption, and such.

Fabrication of data processing device 1 after the design is completed and crosstalk violations have been dealt with, according to aspects of the present invention, involves multiple steps of implanting various amounts of impurities into a semiconductor substrate and diffusing the impurities to selected depths within the substrate to form transistor devices. Masks are formed to control the placement of the impurities. Multiple layers of conductive material and insulative material are deposited and etched to interconnect the various devices. These steps are performed in a clean room environment.

A significant portion of the cost of producing the data processing device involves testing. While in wafer form, individual devices are biased to an operational state and probe tested for basic operational functionality. The wafer is then separated into individual dice which may be sold as bare die or packaged. After packaging, finished parts are biased into an operational state and tested for operational functionality.

Figure 14:
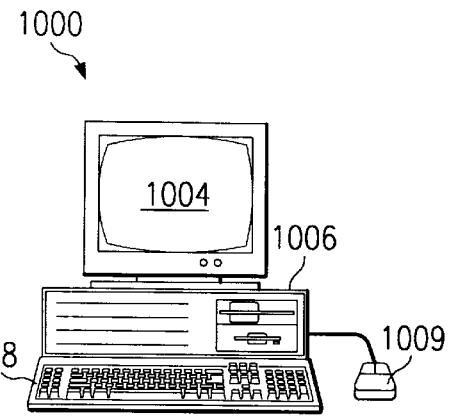
FIG. 14 is an illustration of a computer system which contains a design program for designing integrated circuits incorporating aspects of the present invention.
Figure 15:
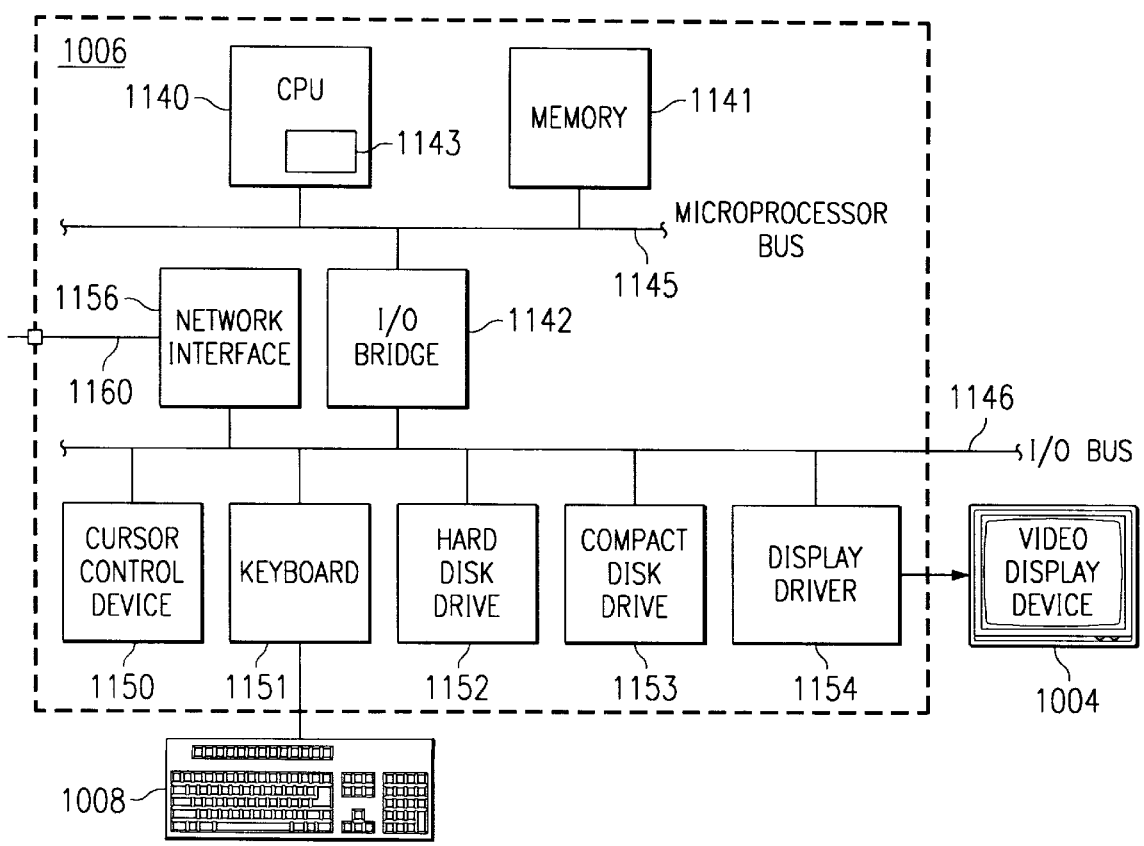
FIG. 15 is a block diagram of the computer of FIG. 14.

FIG. 14 is an illustration of a computer system 1000 which contains a design program incorporating aspects of the present invention, and FIG. 15 is a block diagram of the computer of FIG. 14. A design program that contains steps for designing an integrated circuit according to aspects of the present invention, as described in the preceding paragraphs, is stored on a hard drive 1152. This design program can be introduced into a computer 1000 via a compact disk installed in a compact disk drive 1153, or down loaded via network interact 1156, or by other means, such as a floppy disk or tape, for example. The program is transferred to memory 1141 and instructions which comprise the program are executed by processor 1140. Portions of the integrated circuit design are displayed on monitor 1004. The design program includes a simulator for modeling and extracting parasitic effects and simulating the operation of the integrated circuit in order to determine GOI violations according to aspects of the present invention.

Thus, a novel technique for pruning a large set of coupled signals to identify potential victims and their associated aggressors has been presented. The selected victim signals can then be analyzed in detail to determine if GOI violations exist. This pruning process helps reduce the problem size and hence makes the crosstalk analysis faster. User-defined groups of signals are treated as aggressors during the pruning process. This is a very important and differentiating feature in this pruning process, as it helps in accounting for simultaneous switching of grouped signals. Bus signals can be grouped if no user-defined groups are specified. Usage of groups instead of individual signals helps in selection of more potential aggressors. This in turn helps in uncovering potential GOI failures due to crosstalk.

Advantageously, the number of aggressor groups that could act on a given victim can be controlled in the pruning process, in an embodiment of the present invention. Groups are generated based on the switching or transition patterns. All signals known to switch at the same time are grouped. Grouping of signals can be determined by net name and driver connectivity. However, generation of grouping information based on switching windows or transition information from other sources such as the following could also be done: static timing analysis, timing simulation, and functional simulation.

For efficient processing of the large amounts of parasitic data (typically in millions of parasitic devices), every signal in the design is analyzed separately. This helps in better data management and faster processing. Some signals or groups may not be transitioning during the time when crosstalk on victim is catastrophic. Advantageously, these groups can be excluded during the pruning process.

Using groups during the pruning process could result in large number of individual signals for the R(L)C cluster network generation and detailed analysis. In order to overcome this problem, a signal threshold is used to eliminate signal which have little or no effect on a given victim signal.

The pruning step generates clusters of dominantly coupled signals for each potential victim. These clusters are used to construct a coupled R(L)C network and perform network analysis either using SPICE or other numerical methods. Advantageously, each cluster can be analyzed separately from the rest, and a set of cluster can be analyzed in parallel to reduce computation real time. Each selected cluster is examined for GOI violation potential.

An assumption that all the aggressors switch at the same time and in the same direction results in worst-case crosstalk. This is the normal mode of operation that enables worst-case analysis. In an embodiment of the present invention, all the inputs of a cluster are made to switch at the same time and the time difference between the outputs are measured. If the time difference between outputs are significantly large, then input arrival times can be changed to align all output transitions. Advantageously, switching windows can be used to reduce pessimism.

In another embodiment, other gate oxide electric field strength limits may be selected as appropriate for a given IC process technology and operating environment.

In another embodiment, a different equation than described herein may be used to calculate gate oxide electric field strength. For example, terms may be included to account for band bending and poly depletion.

Although the present invention and its advantages have been described in detail, it should be understood that various changes, substitutions and alterations can be made herein without departing from the spirit and scope of the invention as defined by the appended claims.

What is claimed is:

1. A method for designing an integrated circuit which contains a plurality of signal lines in close proximity, such that capacitive coupling among the signal lines is operable to induce crosstalk on at least one of the signal lines, wherein parasitics are extracted from a trial layout of the integrated circuit, the method comprising the steps of:

grouping the plurality of signal lines into a plurality of aggressor groups;

pruning the plurality of signal lines to form a plurality of victim signal lines;

building a minimum region network for each victim signal line of the plurality of victim signal lines comprising the respective victim signal line, aggressor signal lines associated with the respective victim signal line, and associated parasitics;

simulating the operation of each minimum region network to determine an amount of noise induced on each respective victim signal line by the aggressor signal lines associated with the respective victim signal line; and analyzing the simulation results of each minimum region network to determine if a gate oxide integrity (GOI) violation exists.

2. The method of claim 1, wherein the step of analyzing comprises the step of calculating a peak gate oxide electric field strength for at least a first respective transistor connected to each respective victim signal line.

3. The method of claim 1, wherein the step of analyzing comprises the steps of:

calculating a DC effective gate oxide electric field strength for at least a first respective transistor connected to each respective victim signal line; and determining if the DC effective gate oxide electric field strength of any respective transistor exceeds a selected threshold.

4. The method of claim 1, wherein the step of pruning comprises:

calculating a cumulative percentage coupling to total capacitance (PCCT) for each potential victim signal line from the plurality of signal lines relative to the plurality of aggressor groups; and classifying each potential victim signal line as a victim signal line only if the associated cumulative PCCT exceeds a selected threshold value.

5. The method of claim 4, further comprising the step of modifying the trial layout if the amount of noise induced any of the victim signal lines exceeds a selected value.

6. The method of claim 5, further comprising the step of fabricating the integrated circuit according to the modified trial layout.

7. The method of claim 1, wherein the step of grouping comprises selecting as a first group a set of signal lines which form a bus in the integrated circuit.

8. The method of claim 1, wherein the step of grouping comprises selecting as a first group a set of signal lines which are outputs of a set of latches that are clocked by a same clock signal.

9. The method of claim 1, wherein the step of grouping comprises selecting as a first group a set of signal lines which have signal transitions occurring within a selected time window.

10. The method of claim 1, wherein the step of grouping comprises not including a first signal line within an aggressor group for a first potential victim signal line if the first signal line has a percentage coupling to total capacitance (PCCT) relative to the first potential victim signal line that is less than a selected threshold value.

11. A computer system, comprising:

a processor for processing instructions;

a memory circuit for holding instructions connected to the processor;

a mass storage device for holding a design program operable to transfer the design program to the memory circuit;

wherein the design program on the mass storage device comprises instructions for a method of analyzing an integrated circuit design which contains a plurality of signal lines in close proximity, such that capacitive coupling among the signal lines is operable to induce crosstalk on at least one of the signal lines, wherein parasitics are extracted from a trial layout of the integrated circuit, the method comprising the steps of:

grouping the plurality of signal lines into a plurality of aggressor groups;

pruning the plurality of signal lines to form a plurality of victim signal lines;

building a minimum region network for each victim signal line of the plurality of victim signal lines comprising the respective victim signal line, aggressor signal lines associated with the respective victim signal line, and associated parasitics;

simulating the operation of each minimum region network to determine an amount of noise induced on each respective victim signal line by the aggressor signal lines associated with the respective victim signal line; and analyzing the simulation results of each minimum region network to determine if a gate oxide integrity (GOI) violation exists.

12. A mass storage device for holding a computer program, wherein the design program on the mass storage device comprises instructions for a method of analyzing an integrated circuit design which contains a plurality of signal lines in close proximity, such that capacitive coupling among the signal lines is operable to induce crosstalk on at least one of the signal lines, wherein parasitics are extracted from a trial layout of the integrated circuit, the method comprising the steps of:

grouping the plurality of signal lines into a plurality of aggressor groups;

pruning the plurality of signal lines to form a plurality of victim signal lines;

building a minimum region network for each victim signal line of the plurality of victim signal lines comprising the respective victim signal line, aggressor signal lines associated with the respective victim signal line, and associated parasitics;

simulating the operation of each minimum region network to determine an amount of noise induced on each respective victim signal line by the aggressor signal lines associated with the respective victim signal line; and analyzing the simulation results of each minimum region network to determine if a gate oxide integrity (GOI) violation exists.

13. The mass storage device of claim 12, wherein the mass storage device is a diskette.

\* \* \* \* \*